United States Patent
Taguchi

(10) Patent No.: US 8,853,739 B2
(45) Date of Patent: Oct. 7, 2014

(54) PRESSURE CONTACT SEMICONDUCTOR DEVICE

(75) Inventor: Kazunori Taguchi, Tokyo (JP)

(73) Assignee: Mitsubishi Electric Corporation, Tokyo (JP)

(\*) Notice: Subject to any disclaimer, the term of this patent is extended or adjusted under 35 U.S.C. 154(b) by 0 days.

(21) Appl. No.: 13/371,604

(22) Filed: Feb. 13, 2012

(65) Prior Publication Data

US 2012/0326208 A1    Dec. 27, 2012

(30) Foreign Application Priority Data

Jun. 23, 2011  (JP) .................. 2011-139337

(51) Int. Cl.
 *H01L 29/744*    (2006.01)
(52) U.S. Cl.
 USPC ................. 257/150; 257/E29.212
(58) Field of Classification Search
 USPC .......................... 257/150, E29.212
 See application file for complete search history.

(56) References Cited

U.S. PATENT DOCUMENTS

| | | | | |
|---|---|---|---|---|
| 6,166,402 A * | 12/2000 | Kodani et al. | ......... | 257/182 |
| 6,323,547 B1 * | 11/2001 | Kawamura et al. | ......... | 257/688 |
| 6,445,013 B1 * | 9/2002 | Taguchi | ......... | 257/138 |
| 6,605,870 B2 * | 8/2003 | Miyake et al. | ......... | 257/724 |
| 6,624,448 B2 * | 9/2003 | Taguchi et al. | ......... | 257/150 |
| 2002/0036339 A1 * | 3/2002 | Taguchi et al. | ......... | 257/690 |

FOREIGN PATENT DOCUMENTS

| | | |
|---|---|---|
| JP | 64-067838 | 3/1989 |
| JP | 11-183758 | 7/1999 |
| JP | 2002-70824 | 3/2002 |
| JP | 2002-110903 | 4/2002 |
| JP | 2002-203931 | 7/2002 |
| JP | 2009-153125 | 7/2009 |

OTHER PUBLICATIONS

Japanese OA dated Sep. 17, 2013, issued in corresponding JP patent application No. 2011-139337, with partial English translation.
Japanese Office Action issued May 27, 2014, in JP Application No. 2011-139337, (with partial English translation).

\* cited by examiner

*Primary Examiner* — Julio J Maldonado
*Assistant Examiner* — Jaehwan Oh
(74) *Attorney, Agent, or Firm* — Oblon, Spivak, McClelland, Maier & Neustadt, L.L.P.

(57) ABSTRACT

A pressure contact semiconductor device includes a cathode post electrode and a gate electrode formed on a top surface of a substrate, an anode post electrode formed on a bottom surface thereof, a circuit substrate, a cathode flange overlapping the cathode post electrode and connected to the circuit substrate, a cathode fin electrode overlapping the cathode flange, an anode fin electrode underlapping and the anode post electrode, a gate flange connected to both the gate electrode and the circuit substrate, a securing member having a parallel portion parallel to the circuit substrate and a perpendicular portion perpendicular to the circuit substrate, the perpendicular portion being secured to a side of the cathode fin electrode, and a spacer formed from plate material and secured at the top to the parallel portion of the securing member and at the bottom to the circuit substrate.

4 Claims, 4 Drawing Sheets

PRESSURE CONTACT SEMICONDUCTOR DEVICE

BACKGROUND OF THE INVENTION

1. Field of the Invention

The present invention relates to a pressure contact semiconductor device used, e.g., for high power switching.

2. Background Art

Japanese Laid-Open Patent Publication No. 2002-110903 discloses a pressure contact semiconductor device including a semiconductor substrate through which the main current flows and a circuit substrate in which a gate driver is formed. The semiconductor substrate and the circuit substrate are coupled to each other by means of flanges.

Some pressure contact semiconductor devices are used in vehicles such as, e.g., electric trains. When a pressure contact semiconductor device is used in a vibration environment, the circuit substrate may resonate, resulting in metal fatigue of the flanges. If the flanges become fatigued, it is not possible to ensure sufficient reliability of the pressure contact semiconductor device.

SUMMARY OF THE INVENTION

The present invention has been made to solve the foregoing problem. It is, therefore, an object of the present invention to provide a pressure contact semiconductor device in which the resonance of the circuit substrate is suppressed.

According to one aspect of the present invention, a pressure contact semiconductor device includes a semiconductor substrate having a gate region and a cathode region formed on a top surface thereof and an anode region formed on a bottom surface thereof, a cathode post electrode overlapping and connected to the cathode region, a gate electrode connected to the gate region, an anode post electrode underlapping and connected to the anode region, a circuit substrate, a cathode flange overlapping the cathode post electrode and connected to the circuit substrate, a cathode fin electrode overlapping and connected to the cathode flange, an anode fin electrode underlapping and connected to the anode post electrode, a gate flange connected to both the gate electrode and the circuit substrate, a securing member having a parallel portion parallel to the circuit substrate and a perpendicular portion perpendicular to the circuit substrate, the perpendicular portion being secured to a side of the cathode fin electrode, and a spacer formed from plate material and secured at the top to the parallel portion of the securing member and at the bottom to the circuit substrate.

Other and further objects, features and advantages of the invention will appear more fully from the following description.

DETAILED DESCRIPTION OF THE PREFERRED EMBODIMENTS

First Embodiment

Figure 1:
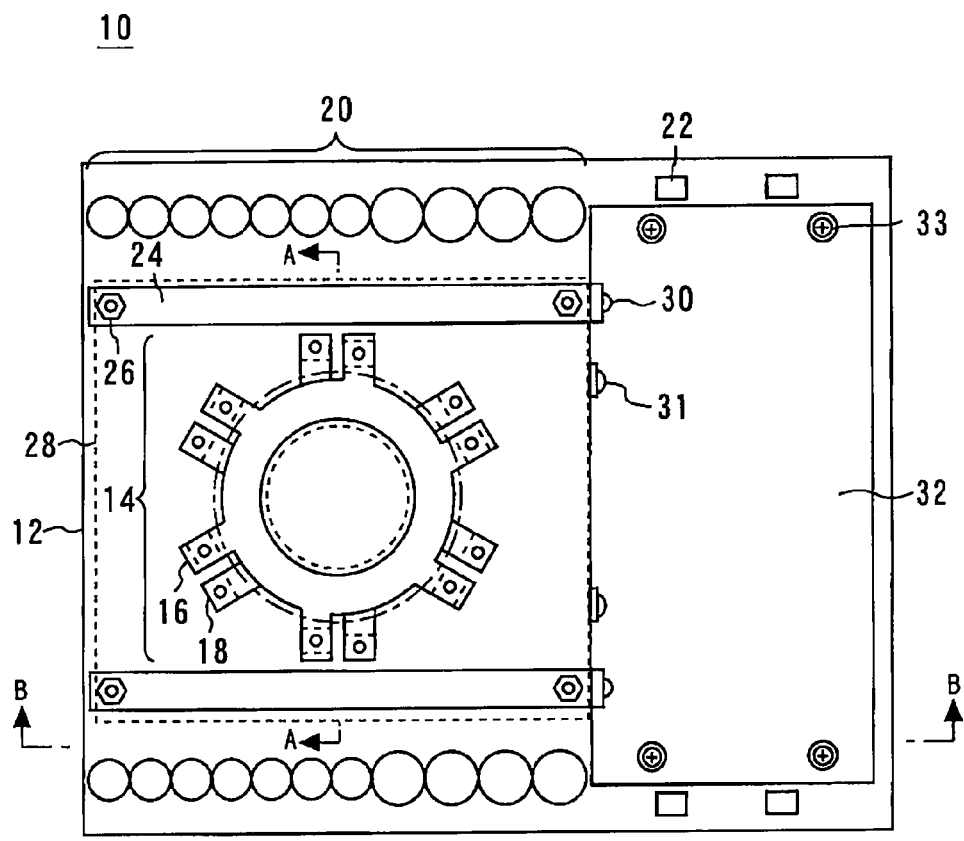
FIG. 1 is a plan view schematically showing a pressure contact semiconductor device in accordance with a first embodiment of the present invention.

FIG. 1 is a plan view schematically showing a pressure contact semiconductor device 10 in accordance with a first embodiment of the present invention. The pressure contact semiconductor device 10 is a GCT thyristor device. The pressure contact semiconductor device 10 includes a circuit substrate 12 serving as a gate drive substrate. A GCT thyristor 14 is secured to the circuit substrate 12. The GCT (gate commuted turn-off) thyristor 14 is a thyristor that can be turned off by commuting the entire main current to the gate side.

The GCT thyristor 14 is provided with a cathode flange 16 and a gate flange 18. The cathode flange 16 is formed from thin disc-shaped conductive plate material having branch-like terminal portions. The gate flange 18 is also made from the same material. The cathode flange 16 and the gate flange 18 are disposed so that their terminal portions are alternately positioned with respect to each other, and so that there is at least a predetermined minimum gate-to-cathode insulation distance between these flanges. The electrical connection of the GCT thyristor 14 to the circuit substrate 12 is established by securing the cathode flange 16 and the gate flange 18 to the circuit substrate 12. Capacitors 20 and transistors 22 are secured to the circuit substrate 12. The capacitors 20 and the transistors 22 are components included in the gate driver.

The pressure contact semiconductor device 10 is provided with a pair of reinforcing members 24. The reinforcing members 24 are L-shaped members and are disposed parallel to each other so as to sandwich the GCT thyristor 14 therebetween. The reinforcing members 24 serve to increase the strength of the pressure contact semiconductor device 10. Each reinforcing member 24 is secured to the circuit substrate 12 by two screws 26. Further, a cathode fin electrode 28 is disposed above the reinforcing members 24. In FIG. 1, the cathode fin electrode 28 is illustrated by showing only its outline (in dashed lines), for convenience of illustration. The reinforcing members 24 are secured to a side of the cathode fin electrode 28 by screws 30.

A securing member 32 is also secured to that side of the cathode fin electrode 28 by screws 31. The securing member 32 is an L-shaped member and is also secured to the circuit substrate 12 by screws 33. The securing member 32 is used to secure the cathode fin electrode 28 and the circuit substrate 12 in place.

Figure 2:
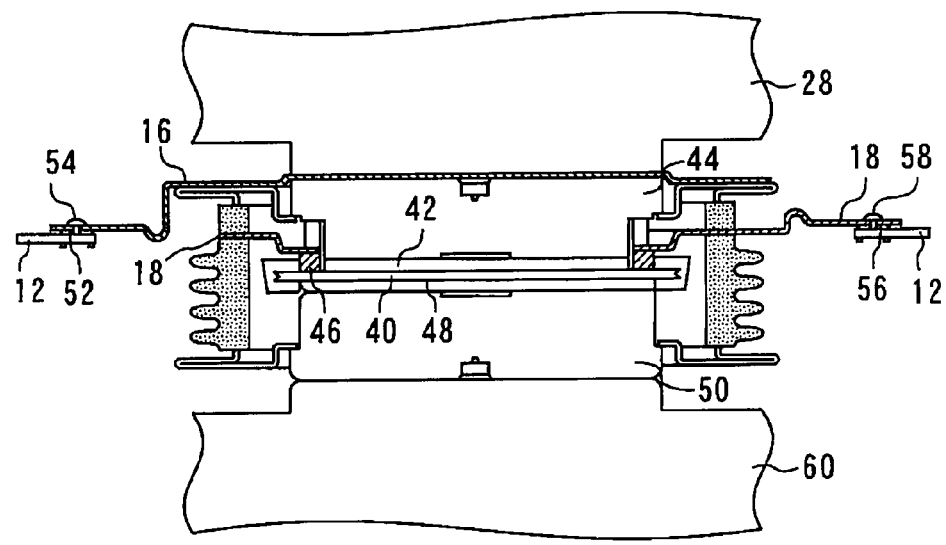
FIG. 2 is a cross-sectional view of the pressure contact semiconductor device taken along section line A-A of FIG. 1.

FIG. 2 is a cross-sectional view of the pressure contact semiconductor device taken along section line A-A of FIG. 1. FIG. 2 primarily shows a cross-section of the GCT thyristor. The GCT thyristor includes a semiconductor substrate 40. A gate region and a cathode region are formed on the top surface of the semiconductor substrate 40, and an anode region is formed on the bottom surface. The cathode region is connected to a cathode post electrode 44 through a cathode strain buffer plate 42. The cathode post electrode 44 is formed to overlap the cathode region.

A gate electrode 46 is connected to the gate region. The anode region is connected to an anode post electrode 50 through an anode strain buffer plate 48. The anode post electrode 50 is formed to underlap the anode region.

The cathode flange 16 overlaps the cathode post electrode 44 and is connected to the circuit substrate 12. A portion of the cathode flange 16 is secured by a cathode screw 54 to a cathode terminal block 52 soldered to the circuit substrate 12. The cathode fin electrode 28 overlaps and is connected to the cathode flange 16. The cathode flange 16 is sandwiched between the cathode post electrode 44 and the cathode fin electrode 28. Thus the cathode flange 16 has a portion sandwiched between the cathode post electrode 44 and the cathode fin electrode 28 and a portion secured to the circuit substrate 12.

The gate flange 18 is connected to the gate electrode 46 and also connected to the circuit substrate 12. A portion of the gate flange 18 is secured by a gate screw 58 to a gate terminal block 56 soldered to the circuit substrate 12. As described above, the semiconductor substrate 40 is electrically connected to the circuit substrate 12 through the cathode flange 16 and the gate flange 18.

An anode fin electrode 60 underlaps and is connected to the anode post electrode 50. The semiconductor substrate 40, the cathode strain buffer plate 42, the anode strain buffer plate 48, the cathode post electrode 44, the anode post electrode 50, and the cathode flange 16 are held in pressure contact with one another by being sandwiched between the cathode fin electrode 28 and the anode fin electrode 60.

Figure 3:
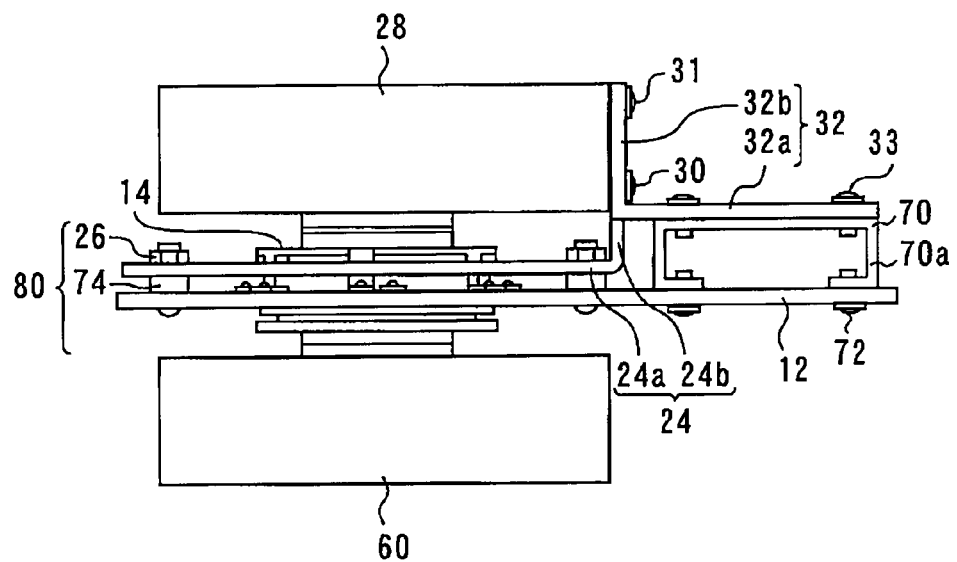
FIG. 3 is a cross-sectional view of the pressure contact semiconductor device taken along section line B-B of FIG. 1.

FIG. 3 is a cross-sectional view of the pressure contact semiconductor device taken along section line B-B of FIG. 1. The securing member 32 has a parallel portion 32a parallel to the circuit substrate 12 and a perpendicular portion 32b perpendicular to the circuit substrate 12. The perpendicular portion 32b is secured to a side of the cathode fin electrode 28 by the screws 31. The pressure contact semiconductor device 10 is provided with a spacer 70. The spacer 70 is formed from plate material. Specifically, the spacer 70 includes support portions 70a at its longitudinally opposite ends and is formed by pressing a piece of plate material.

The spacer 70 is secured at the top to the parallel portion 32a of the securing member 32 and at the bottom to the circuit substrate 12. The connection of the parallel portion 32a of the securing member 32 to the upper portion of the spacer 70 is accomplished by means of screws 33. The connection of the lower portions of the spacer 70 to the circuit substrate 12 is accomplished by means of screws 72. In this way the spacer 70 is secured to the securing member 32 and the circuit substrate 12.

The reinforcing members 24 have a parallel portion 24a parallel to the circuit substrate 12 and a perpendicular portion 24b perpendicular to the circuit substrate 12. Rings 74 are disposed between the parallel portion 24a of each reinforcing member 24 and the circuit substrate 12 and separate them a predetermined distance. The perpendicular portions 24b of the reinforcing members 24 are secured to a side of the cathode fin electrode 28 by the screws 30. In this way the cathode fin electrode 28 is secured to the circuit substrate 12 by use of the reinforcing members 24, the securing member 32, and the spacer 70.

The components of the pressure contact semiconductor device 10 other than the cathode fin electrode 28 and the anode fin electrode 60, that is, the portions of the device held together by the pressure between the cathode fin electrode 28 and the anode fin electrode 60, together constitute a gate drive unit 80.

Figure 4:
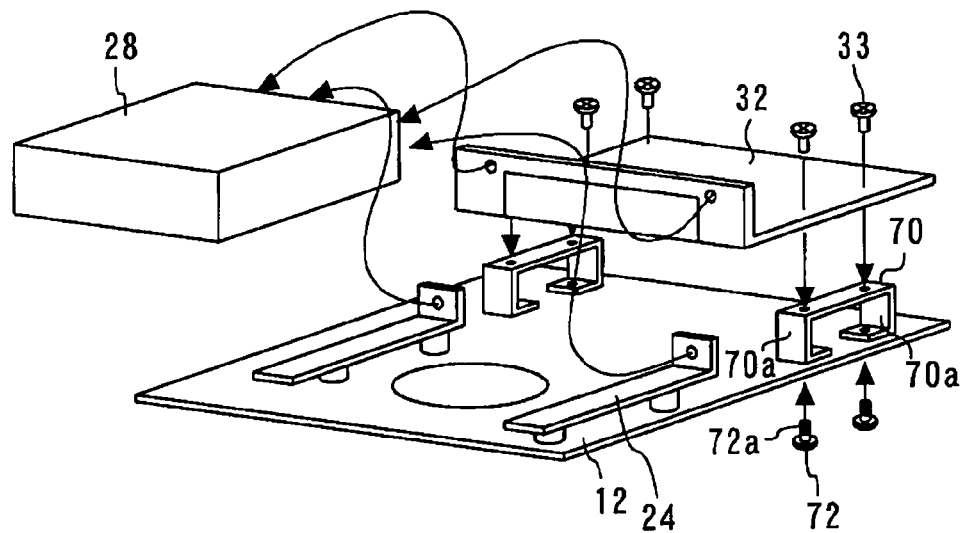
FIG. 4 is a perspective view showing the assembly of the pressure contact semiconductor device of the first embodiment.

FIG. 4 is a perspective view showing the assembly of the pressure contact semiconductor device of the first embodiment. The screw threads of the screws 72 are coated with adhesive 72a including microcapsules filled with epoxy resin. The components are brought together in the directions of the arrows of FIG. 4 and secured together by screws.

When a pressure contact semiconductor device, such as the pressure contact semiconductor device of the first embodiment, is used in a vibration environment, stress occurs in the cathode flange and the gate flange due to the moments around the connection points between the reinforcing members and the cathode fin electrode and between the securing member and the cathode fin electrode, with the connection points acting as fulcrums. In the case of the pressure contact semiconductor device of the above Japanese Laid-Open Patent Publication No. 2002-110903, in which the securing member and the circuit substrate are secured by means of a heavy fin block, the stress is likely to cause the circuit substrate to resonate. The resonance of the circuit substrate may result in metal fatigue of the cathode flange and the gate flange. In such a case, the terminal portions of the gate flange and the terminal portions of the cathode flange experience significant metal fatigue.

In the case of the pressure contact semiconductor device 10 of the first embodiment, however, the securing member 32 and the circuit substrate 12 are secured together by use of the spacer 70, which is formed from plate material and hence is lightweight. Therefore, even when the pressure contact semiconductor device 10 is used in a severe vibration environment, vibration energy induced in the gate drive unit 80 can be reduced so as to prevent the resonance of the circuit substrate 12. Thus in the pressure contact semiconductor device 10 of the first embodiment, the metal fatigue of the cathode flange 16 and the gate flange 18 can be minimized, thereby increasing the reliability of the device. Further, the spacer 70 can be easily manufactured merely by bending a piece of plate material, meaning that the spacer 70 is low-cost and can be easily mounted.

In the pressure contact semiconductor device 10 of the first embodiment, the screw threads of the screws 72 are coated with the adhesive 72a, thereby preventing loosening of the screws 72 due to the vibration of the circuit substrate 12.

Figure 5:
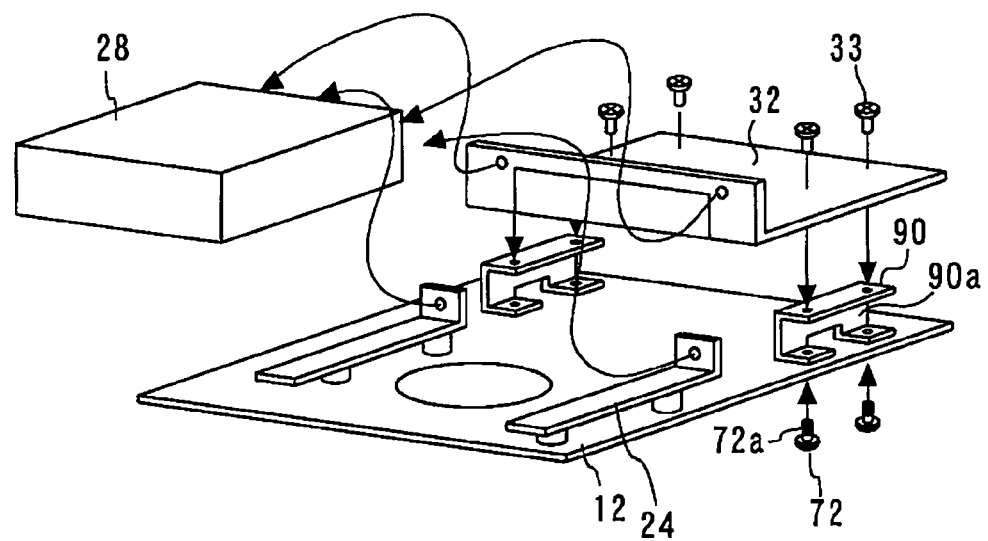
FIG. 5 is a perspective view showing a variation of the pressure contact semiconductor device of the first embodiment.

FIG. 5 is a perspective view showing a variation of the pressure contact semiconductor device of the first embodiment. This pressure contact semiconductor device is characterized by the use of a spacer 90 having a particular shape. The spacer 90 is formed by pressing a piece of plate material and has a support portion 90a extending in the longitudinal direction of the spacer and supporting the securing member 32. The length of the support portion 90a can be selected to be greater than that of the support portion 70a of the spacer 70 described above so that the spacer 90 has greater rigidity than the spacer 70. This means that the resonance of the circuit substrate 12 can be suppressed by securing the circuit substrate 12 to the securing member 32 using the lightweight, highly rigid spacer 90.

Second Embodiment

Figure 6:
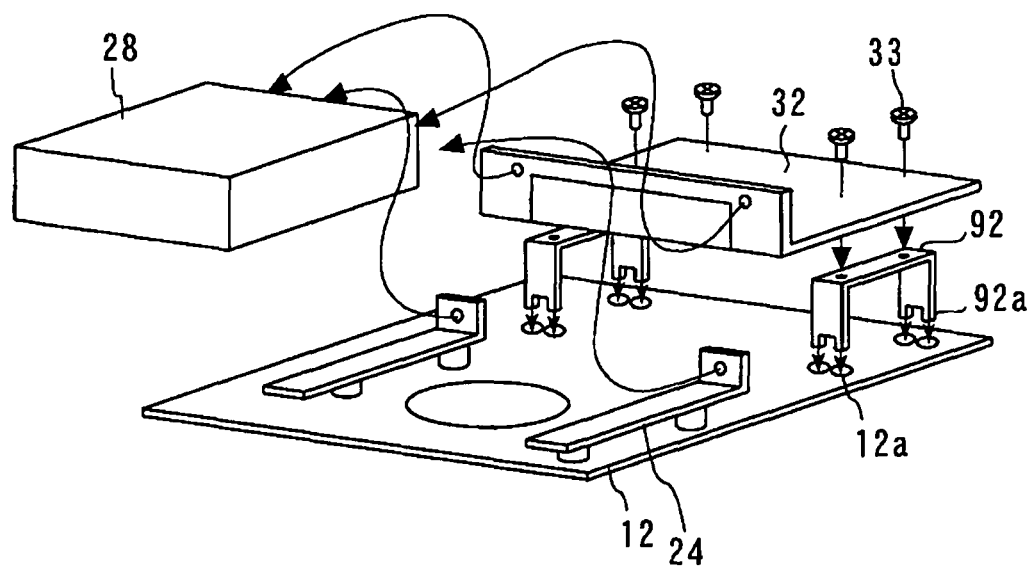
FIG. 6 is a perspective view showing the assembly of the pressure contact semiconductor device of the second embodiment.

The following description of a pressure contact semiconductor device in accordance with a second embodiment of the present invention will be primarily directed to the differences from the pressure contact semiconductor device of the first embodiment. FIG. 6 is a perspective view showing the assembly of the pressure contact semiconductor device of the second embodiment.

Through-holes 12a are formed in the circuit substrate 12. A spacer 92 (which corresponds to the spacer 70 of the first embodiment) has projections 92a formed on its lower portions in such a manner that the projections can be inserted into the through-holes 12a. These projections 92a are inserted into the through-holes 12a.

Figure 7:
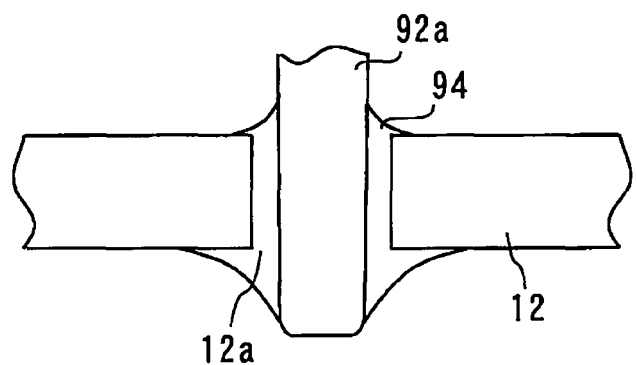
FIG. 7 is a diagram showing a method for securing the spacer in accordance with the second embodiment.

FIG. 7 is a diagram showing a method for securing the spacer in accordance with the second embodiment. The projections 92a are inserted into the through-holes 12a and secured to the circuit substrate 12 by solder 94. Thus in the pressure contact semiconductor device of the second embodiment, the spacer 92 is secured to the circuit substrate 12 by means of solder, eliminating the need for screws for that purpose and hence making it possible to manufacture the pressure contact semiconductor device at low cost. It should be noted that the pressure contact semiconductor device of the second embodiment is susceptible of at least alterations similar to those that can be made to the pressure contact semiconductor device of the first embodiment.

In accordance with the present invention it is possible to reduce the weight of a pressure contact semiconductor device and thereby suppress the resonance of its circuit substrate.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2011-139337, filed on Jun. 23, 2011 including specification, claims, drawings and summary, on which the Convention priority of the present application is based, are incorporated herein by reference in its entirety.

What is claimed is:

1. A pressure contact semiconductor device comprising:
a semiconductor substrate having a gate region and a cathode region formed on a top surface thereof and an anode region formed on a bottom surface thereof;
a cathode post electrode overlapping and connected to said cathode region;
a gate electrode connected to said gate region;
an anode post electrode underlapping and connected to said anode region;
a circuit substrate;
a cathode flange overlapping said cathode post electrode and connected to said circuit substrate;
a cathode fin electrode overlapping and connected to said cathode flange;
an anode fin electrode underlapping and connected to said anode post electrode;
a gate flange connected to both said gate electrode and said circuit substrate;
a securing member having a parallel portion parallel to said circuit substrate and a perpendicular portion perpendicular to said circuit substrate, said perpendicular portion being secured to a side of said cathode fin electrode and said parallel portion extending from said perpendicular portion in a direction away from said cathode fin electrode; and
a spacer formed by bending plate material and secured at the top to said parallel portion of said securing member and at the bottom to said circuit substrate.

2. The pressure contact semiconductor device according to claim 1, wherein said spacer has a support portion extending in the longitudinal direction of said spacer and supporting said securing member.

3. The pressure contact semiconductor device according to claim 1, further comprising:
a screw connecting a lower portion of said spacer to said circuit substrate; and
adhesive coated on screw threads of said screw and including microcapsules filled with epoxy resin.

4. The pressure contact semiconductor device according to claim 1, wherein:
said circuit substrate has a through-hole formed therein;
said spacer has formed on a lower portion thereof a projection which can be inserted into said through-hole; and
said projection is inserted into said through-hole and soldered to said circuit substrate.

* * * * *